(12) United States Patent
Fan et al.

(10) Patent No.: US 8,692,302 B2
(45) Date of Patent: Apr. 8, 2014

(54) CMOS IMAGE SENSOR WHITE PIXEL PERFORMANCE

(75) Inventors: Ming-Chi Fan, Hsinchu County (TW); Yi-Lii Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1370 days.

(21) Appl. No.: 11/687,417

(22) Filed: Mar. 16, 2007

(65) Prior Publication Data

US 2008/0227249 A1 Sep. 18, 2008

(51) Int. Cl.
*H01L 31/062* (2012.01)

(52) U.S. Cl.
USPC .......................................................... 257/292

(58) Field of Classification Search
USPC ............................................ 257/80, 292, 437
See application file for complete search history.

(56) References Cited

U.S. PATENT DOCUMENTS

| | | | |
|---|---|---|---|
| 4,764,248 A * | 8/1988 | Bhattacherjee et al. ...... | 438/439 |
| 5,279,973 A * | 1/1994 | Suizu ............................ | 438/795 |
| 6,080,630 A * | 6/2000 | Milic-Strkalj et al. ........ | 438/305 |
| 6,194,258 B1 * | 2/2001 | Wuu ............................. | 438/200 |
| 6,627,475 B1 * | 9/2003 | Yang et al. ....................... | 438/57 |
| 6,642,076 B1 | 11/2003 | Yaung et al. | |
| 6,972,222 B2 * | 12/2005 | Cho et al. ....................... | 438/197 |
| 2001/0055845 A1 * | 12/2001 | Arai et al. ...................... | 438/234 |
| 2002/0058402 A1 * | 5/2002 | Wieczorek et al. ........... | 438/586 |
| 2004/0075110 A1 * | 4/2004 | Yaung et al. ................... | 257/200 |
| 2005/0205955 A1 * | 9/2005 | Shim ............................. | 257/432 |
| 2005/0230681 A1 | 10/2005 | Folkerts et al. | |
| 2006/0214251 A1 * | 9/2006 | Ratnam et al. ................. | 257/437 |

FOREIGN PATENT DOCUMENTS

| | | | |
|---|---|---|---|
| KR | 20020045259 A | 6/2002 | |
| KR | 20020085074 | 11/2002 | |
| KR | 10-2004-0058697 | * 7/2004 | ........... H01L 27/146 |

OTHER PUBLICATIONS

KR 10-2004-0058697(English Translation) - - - Jul. 2004 - - - Jung Hwang - - - .*
Chinese Patent Office, Office Action dated Mar. 2, 2012, Application No. 200810003536.3, 4 pages.
Taiwanese Patent Office, Office Action dated Jul. 14, 2010, Application No. 096119450, 7 pages.

* cited by examiner

*Primary Examiner* — Yu-Hsi D Sun
(74) *Attorney, Agent, or Firm* — Haynes and Boone, LLP

(57) ABSTRACT

Methods and systems for forming a photodiode in a substrate, forming a source/drain region in the substrate and extending over at least a portion of the photodiode, and growing a thermal oxide layer over the photodiode by performing a rapid thermal anneal (RTA) process utilizing an oxidizing environment.

4 Claims, 5 Drawing Sheets

CMOS IMAGE SENSOR WHITE PIXEL PERFORMANCE

BACKGROUND

Two different types of image sensors can be realized in CMOS technology: passive and active pixel sensors (APS). The difference between these two types is that a passive pixel does not perform the signal amplification performed by an active pixel. A passive pixel sensor may simply comprise a photodiode (MOS or p-n junction diode) with a transistor that passes photoelectrically generated signal charge to an amplifier outside the pixel array. In an active pixel, the integrated charge is amplified by a source follower transistor, for example, and then transported in the channel of a reset transistor.

With regard to both passive and active pixel sensors, it has been determined that excessive current leakage from the photosensitive (e.g., photodiode) regions is a significant cause of white pixel problems. It is a problem that, despite many previously attempted solutions, there are still large numbers of white pixels in CMOS image sensors. In a CMOS image sensor, current flow from the photodiode to ground is used to measure the intensity of incident light. Any additional source of leakage current will adversely affect the performance of the CMOS image sensor. That is, defective pixels will appear to be in the presence of a bright light source even when the pixel is exposed to darkness. Such pixels are called "white pixels" since these locations in the CMOS image pixel array always appear to be "white" regardless of the actual incident image.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
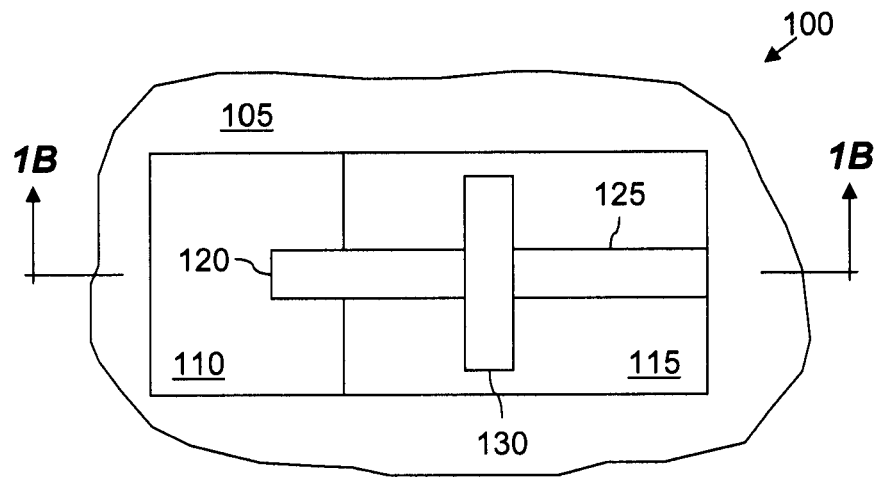
FIG. 1A is a top view of at least a portion of an apparatus according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1B:
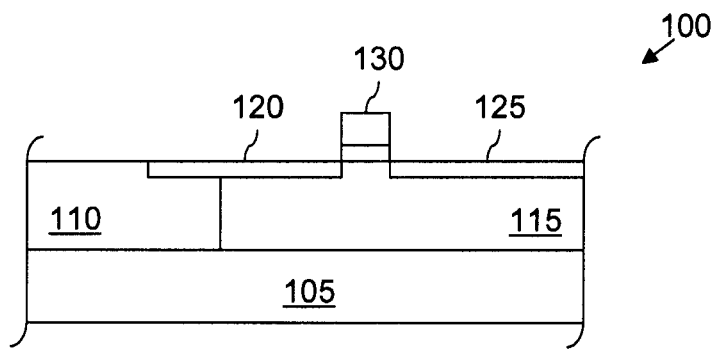
FIG. 1B is a sectional view of the apparatus shown in FIG. 1A.

Referring to FIGS. 1A and 1B, collectively, illustrated in FIG. 1A is a top view of at least a portion of an apparatus 100, and illustrated in FIG. 1B is a sectional view of the apparatus 100, according to one or more aspects of the present disclosure. The apparatus 100 is at least a portion of a CMOS image sensor apparatus.

For example, the apparatus 100 includes a photodiode or other photosensitive element 110 formed in or on a substrate 105. The substrate 105 is or includes a semiconductor body or other silicon substrate, although the substrate 105 may alternatively or additionally comprise germanium and/or gallium arsenide, among other materials. The photodiode 110 may be or include an n-well formed in the substrate 105, wherein the substrate 105 may be a p-type substrate. Alternatively, the n-well of the photodiode 110 may be formed in a p-type well or other region of the substrate 105.

In the exemplary embodiment of FIGS. 1A and 1B, the photodiode 110 is formed adjacent a p-well 115 that is formed in or otherwise integral to the substrate 105. The p-well 115 forms a portion of a transistor that further includes a source region 120, a drain region 125, and a gate stack 130 laterally interposing the source and drain regions 120 and 125. The source region 120 extends over at least a portion of the photodiode 110, and may also extend over a portion of the transistor p-well 115, as shown in FIGS. 1A and 1B. Alternatively, the source region 120 may extend over photodiode 110 but not over the p-well 115, such as where the gate stack 130 shares a vertical boundary with the interface between the photodiode 110 and the p-well 115.

In the discussion above, the photodiode 110 is described as including an n-type well, while the substrate 105 and transistor well 115 are described as being p-type. However, other embodiments within the scope of the present disclosure include other doping schemes, including where the photodiode 110 includes a p-type well and/or where the substrate 105 and/or the well 115 is n-type.

Figure 2A:
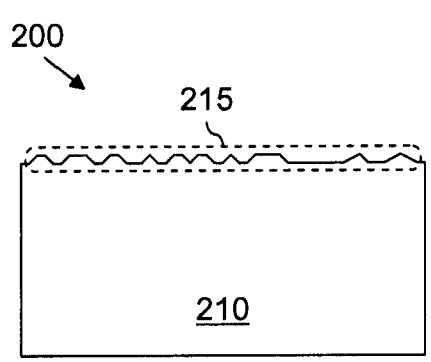
FIG. 2A is a sectional view of at least a portion of an apparatus in an intermediate stage of manufacture according to one or more aspects of the present disclosure.

Referring to FIG. 2A, illustrated is a sectional view of at least a portion of the photodiode 110 shown in FIGS. 1A and 1B, herein designated by reference numeral 210. During formation of the photodiode 210 and/or subsequent processing steps, the surface 215 of the substrate in which the photodiode 210 is formed may become damaged. For example, the surface 215 may become irregular, or exhibit excessive surface roughness. The molecular structure or crystallographic orientation at the surface 215 may also be irregular or otherwise undesired. Consequently, as processing continues, the interface defect density at the surface 215 can increase, which can increase white pixel count and otherwise lessen product performance and yield.

Figure 2B:
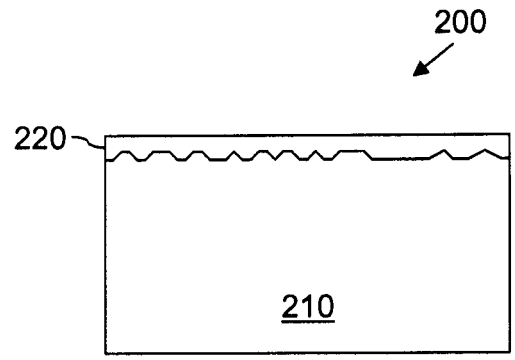
FIG. 2B is a sectional view of the apparatus shown in FIG. 2A in a subsequent stage of manufacture.

Accordingly, with reference to FIG. 2B, a thin thermal oxide layer 220 is formed on the surface 215. In an exemplary embodiment, the oxide layer 220 is formed during a rapid thermal anneal (RTA) process employed in the fabrication of source/drain regions overlying or proximate the photodiode 210. For example, a conventional RTA for S/D formation is performed in a nitrogen ($N_2$) environment. However, according to aspects of the present disclosure, the RTA may be performed in an environment that also includes oxygen ($O_2$) during the temperature ramp-up step of the RTA. In an exemplary embodiment, the RTA may be performed in an environment consisting only of $N_2$ and $O_2$, or consisting of only a nitrogen and oxygen mixture. The RTA may also be performed to simultaneously activate dopants in the source/drain regions, repair damage resulting from the ion implantation process utilized to define the source/drain regions, and/or direct migration of dopants implanted to define the source/drain regions.

By performing the RTA ramp-up in an environment comprising both $N_2$ and $O_2$, the thin thermal oxide layer 220 may be allowed to form on the photodiode 210 to a thickness of about 25 Å. However, other thicknesses are also within the scope of the present disclosure. For example, the thickness of the oxide layer 220 may range between about 15 Å and about 50 Å. However, the thickness of the oxide layer 220 may be limited to that thickness which is necessary to enclose the damaged portion of the surface 215 of the photodiode 210. For example, the thickness of the oxide layer 220 may be about 25 Å where the surface roughness of the surface 215 ranges up to about 20 Å.

Figure 3:
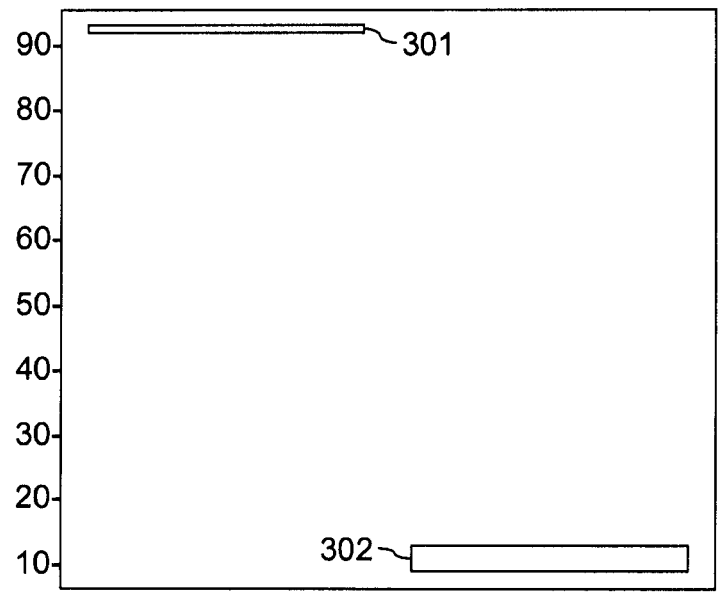
FIG. 3 is a chart demonstrating one or more aspects of the present disclosure.

The existence of the oxide layer 220 on the surface 215 of the photodiode can suppress interface defect density, and can also reduce the leakage source of a pixel area. For example, experimental results depicted in FIG. 3 demonstrate that introducing $O_2$ into the $N_2$ environment during the RTA ramp-up can decrease white pixel count. That is, when the standard RTA utilizing a conventional $N_2$ environment is employed, white pixel count 301 can be greater than 90 per CMOS image pixel array. However, the experimental results shown in FIG. 3 demonstrate that, when $O_2$ is introduced into the RTA ramp-up environment, white pixel count 302 can be less than 10 per CMOS image pixel array. In an exemplary embodiment, introducing $O_2$ to the RTA ramp-up environment can reduce the white pixel count by at least about 81% relative to utilizing only an $N_2$ environment during the RTA ramp-up.

Returning to FIG. 2B, similar benefits may also be obtained by ex-situ oxidation of the surface 215. That is, in the description above, the formation of the thin thermal oxide layer 220 is performed in-situ with the source/drain RTA. However, other means of forming the thin thermal oxide layer 220 are also within the scope of the present disclosure, including forming the thin thermal oxide layer 220 at a different time than during the source/drain RTA and/or in a different chamber than that in which the source/drain RTA is performed. Consequently, a method 400A shown in FIG. 4A depicts in flow-chart format an in-situ method 400A of forming the thin thermal oxide layer while simultaneously performing the source/drain RTA, whereas the method 400B depicted in FIG. 4B is an ex-situ method of forming the thin thermal oxide layer separately from the source/drain RTA.

Figure 4A:
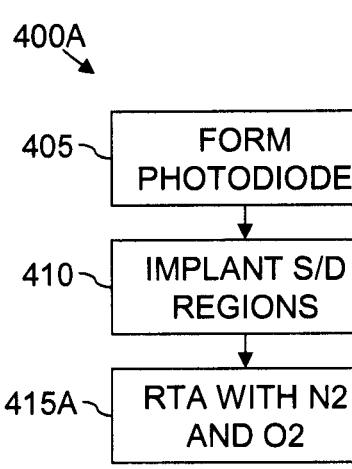
FIG. 4A is a flow-chart diagram of at least a portion of a method according to one or more aspects of the present disclosure.
Figure 4B:
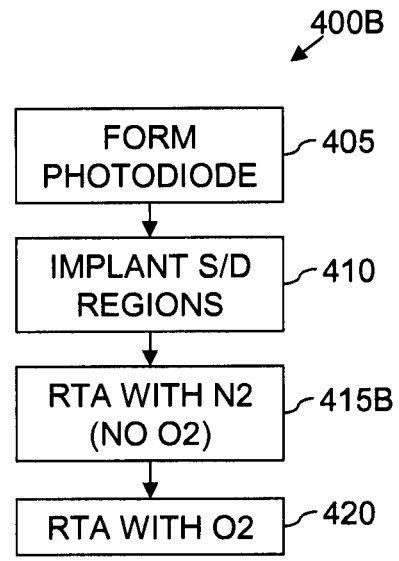
FIG. 4B is a flow-chart diagram of at least a portion of a method according to one or more aspects of the present disclosure.

That is, as shown in FIG. 4A, method 400A includes forming the photodiode in a step 405, and subsequently implanting source and drain regions in a step 410. Thereafter, during a step 415A, an RTA is performed utilizing the conventional $N_2$ environment but with the addition of $O_2$ during the ramp-up process. Similarly, as shown in FIG. 4B, method 400B includes the same steps 405 and 410 to form the photodiode and the source/drain regions. However, instead of performing step 415A as in method 400A, method 400B includes a step 415B during which a conventional RTA is performed utilizing only the conventional $N_2$ environment during the ramp-up process. Thereafter, during a step 420, another RTA is performed utilizing an environment comprising $O_2$. The RTA performed during step 420 in an $O_2$ environment forms the thin thermal oxide layer that is similarly performed during the $N_2+O_2$ RTA of step 415A in method 400A. Additionally, the RTA performed during step 420 may utilize a gas flow of $N_2+O_2$, $O_2$ only, or another composition comprising $O_2$ or other forms of oxygen.

Figure 5:
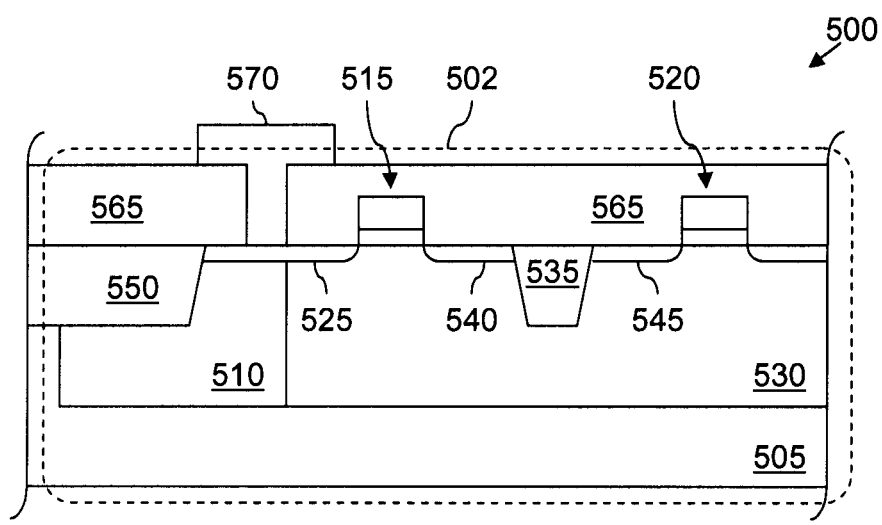
FIG. 5 is a sectional view of at least a portion of an apparatus according to one or more aspects of the present disclosure.

Referring to FIG. 5, illustrated is a sectional view of an apparatus 500 according to one or more aspects of the present disclosure. The apparatus 500 is one environment in which aspects of the present disclosure may be implemented. For example, the apparatus 500 may include the apparatus 100 shown in FIGS. 1A and 1B, and/or the apparatus 200 shown in FIG. 2B. The apparatus 500 may be characterized by the experimental results shown in FIG. 3, and one or more aspects of the manufacture of the apparatus 500 may be substantially similar or identical to the method 400A shown in FIG. 4A and/or the method 400B shown in FIG. 4B. The apparatus 500 is a CMOS image sensor device comprising a plurality of pixel cells. A substantial portion of one such cell 502 is shown in FIG. 5.

The apparatus 500 includes a photodiode formed by an n-well 510 and a p-type substrate 505. The n-well 510 forms a first terminal of the photodiode and the substrate 505 forms a second terminal. Under reverse bias, a depletion region forms between the n-well 510 and the substrate 505. Photoelectric current is generated as light photons interact within the depletion region.

The apparatus 500 also includes two MOS transistors 515 and 520. The transistor 515 includes a source region 525 formed in the n-well 510 terminal of the photodiode. The source region 525 may extend over a portion of the n-well 510 and also a portion of a p-well 530 that is also formed in the substrate 505 and that forms channel regions of the MOS transistors 515 and 520. A shallow trench isolation (STI) region 535 may extend into the p-well 530, thereby isolating a drain region 540 of the transistor 515 from a source/drain region 545 of the transistor 520. Another STI region 550 may isolate the source region 525 of the transistor 515 from a proximate source/drain region (not shown). A dielectric layer 565 may be formed over at least a portion of the photodiode (n-well 510) and the transistors 515 and 520 and thereafter patterned such that a conductive element 570 may interconnect the source region 525, other elements of the transistors 515 and 520, and/or other elements of the apparatus 500 (not shown). As will be described below with reference to FIG. 6, the transistor 515 may be a reset transistor for the pixel cell 502.

Figure 6:
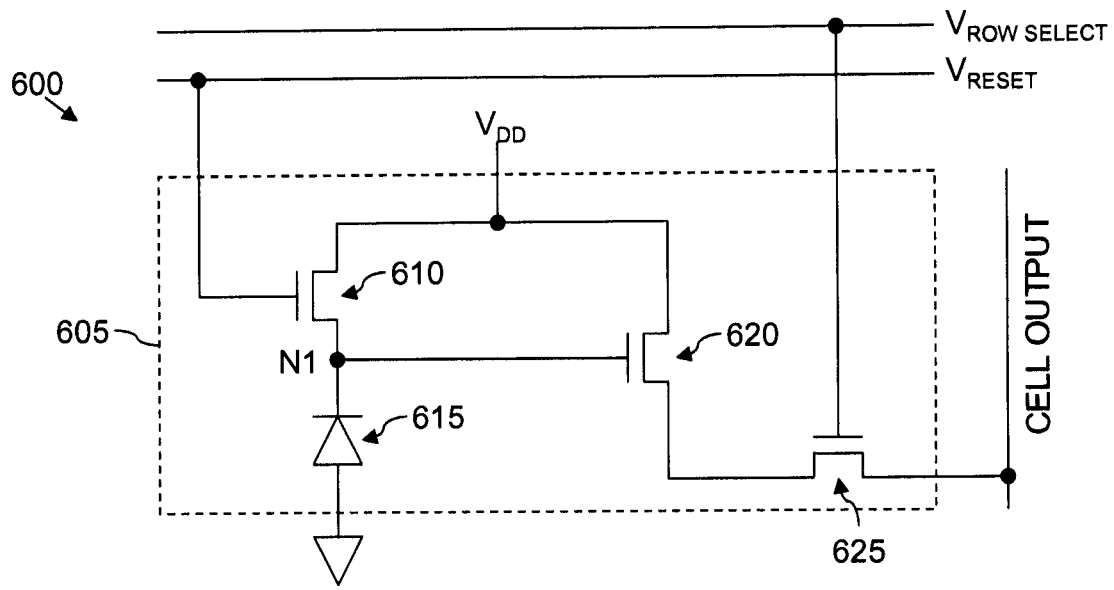
FIG. 6 is a schematic of at least a portion of an apparatus according to one or more aspects of the present disclosure.

Referring to FIG. 6, illustrated is wiring schematic of an apparatus 600 according to one or more aspects of the present disclosure. The apparatus 600 may include a three-transistor CMOS image sensor pixel cell 605 that may be at least partially realized by the apparatus 500 shown in FIG. 5.

In operation, a node N1 is set to a predetermined Voltage $V_{DD}$, (which may be different from a circuit operating voltage $V_{DD}$) by turning on an n-type reset transistor 610. The state of the reset transistor is determined by controlling a reset voltage $V_{RESET}$. As $V_{RESET}$ goes high, the node N1 ramps to $V_{DD'}$. Thereafter, the reset transistor 610 is turned off and photoelectrons are generated by the incident light on a photosensitive element in the form of a photodiode 615. The photodiode 615 is substantially as described above with respect to FIG. 2B. For example, manufacture of the photodiode 615 may include performance of the method 400A shown in FIG. 4A and/or the method 400B shown in FIG. 4B. The photodiode 615 may be characterized by the chart depicted in FIG. 3.

As photoelectrons are injected into node N1, the voltage on node N1 may be reduced by a value of $V_{SENSE}=V_{DD'}-(I_{PHOTO} \times T_{ILLUMINATE}/C_{N1})$, where $I_{PHOTO}$ is the photocurrent induced by the incident light, $T_{ILLUMINATE}$ is the illumination time period, and $C_{N1}$ is the capacitance on node N1. Both $V_{DD'}$ and $V_{SENSE}$ may be read out of the pixel by a source follower transistor 620 by activating a row-select transistor 625. In a two-dimensional array of cells, there are typically row-select transistors and column-select transistors that allow the cells to be sequentially sampled. The row select transistor 625 is activated by manipulating a row-select signal, $V_{ROW\ SELECT}$. After sampling occurs, the cell is reset by causing $V_{RESET}$ to go high.

Those skilled in the art may refer to this operation as double sampling, which can be used to remove noise in high performance imaging systems. Double sampling involves taking two samples of a sensor output, including a reference sample that includes background noise and noise derived from a device mismatch, and then a second sample of the background noise, device mismatch, and the data signal. Subtracting the two samples removes any noise which is common (or correlated) to both, leaving only the data signal.

Figure 7:
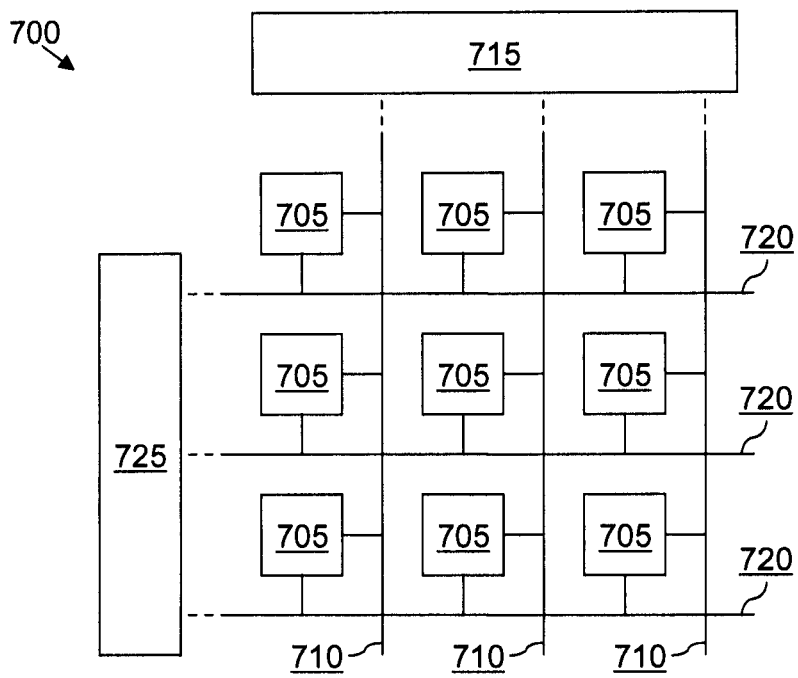
FIG. 7 is a schematic of at least a portion of an apparatus according to one or more aspects of the present disclosure.

Referring to FIG. 7, illustrated is a wiring schematic of an apparatus 700 according to one or more aspects of the present disclosure. For example, the apparatus 700 may include the apparatus 100 shown in FIGS. 1A and 1B, the apparatus 200 shown in FIG. 2B, and/or the apparatus 500 shown in FIG. 5. The apparatus 700 may be characterized by the experimental results shown in FIG. 3, and one or more aspects of the manufacture of the apparatus 700 may be substantially similar or identical to the method 400A shown in FIG. 4A and/or the method 400B shown in FIG. 4B. In an exemplary embodiment, the apparatus 700 is at least a portion of a CMOS image sensor array, one environment in which one or more aspects of FIGS. 1A-6 may be implemented.

The apparatus 700 comprises a number of cells 705 arranged in a two-dimensional pattern of horizontal rows and vertical columns. The cells 705 are connected in a vertical direction to readlines 710. The readlines 710 pass signals to a read-out element 715. In the horizontal direction, the cells 705 are connected to selection lines 720 via which a selection signal can be sent to a row to be read out, where the row is selected by addressing means 725. In the horizontal direction, the cells can also be connected by horizontal reset lines that are not shown in FIG. 7.

Figure 8:
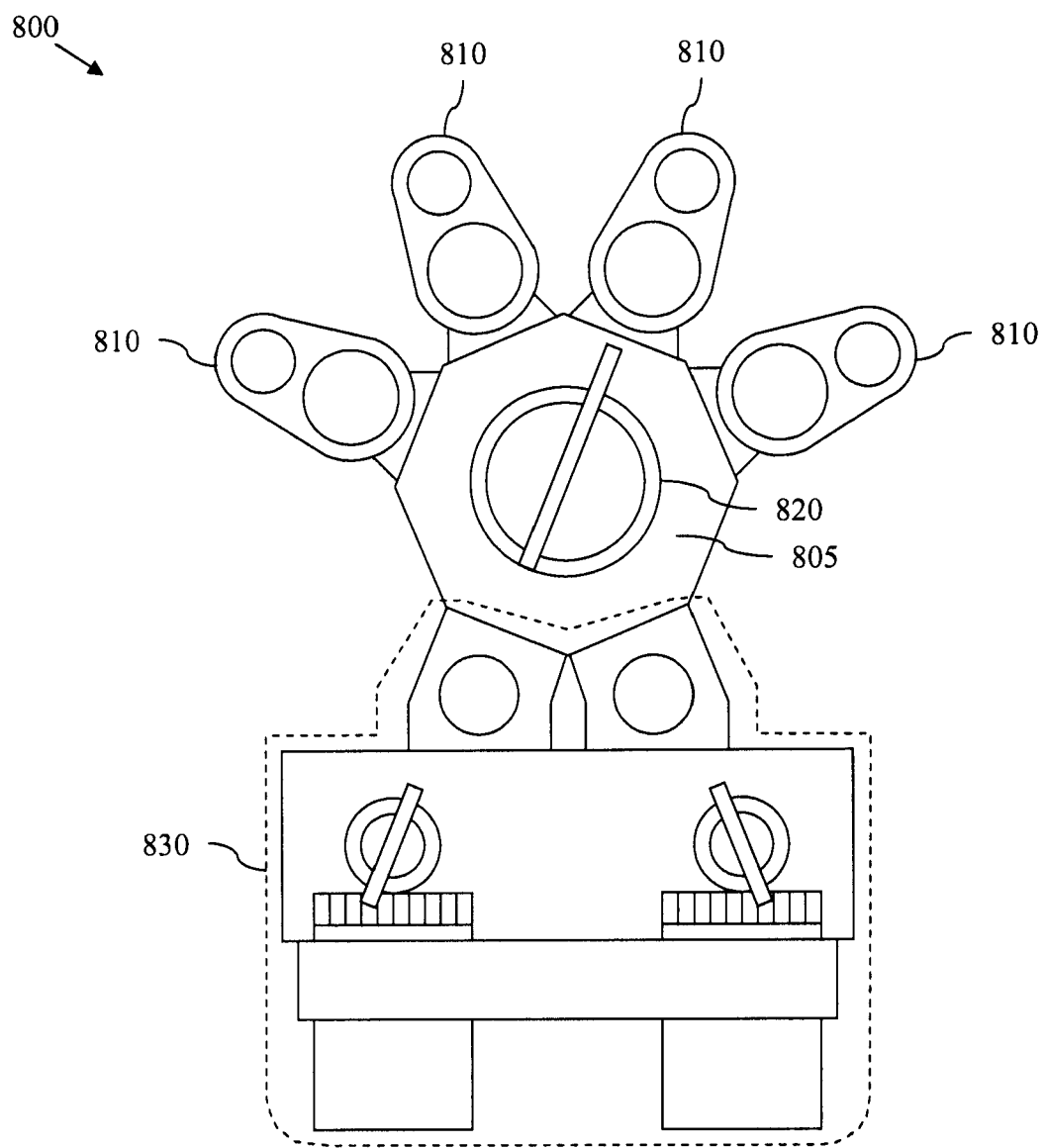
FIG. 8 is a schematic of at least a portion of an apparatus according to one or more aspects of the present disclosure.

Referring to FIG. 8, illustrated is a schematic view of at least a portion of an apparatus 800 according to one or more aspects of the present disclosure. The apparatus 800, which may generally resemble a cluster tool, may be employed with or during the method 400A shown in FIG. 4A and/or the method 400B shown in FIG. 4B, among other methods that may be performed via the apparatus 800 in the manufacture of the apparatus 100 shown in FIGS. 1A and 1B, the apparatus 200 shown in FIG. 2B, the apparatus 500 shown in FIG. 5, the apparatus 600 shown in FIG. 6, and/or the apparatus 700 shown in FIG. 7. For example, the apparatus 800 may be employed to form a thin oxide layer over the damaged surface of a photodiode, including photodiodes formed within the apparatus 800 or other equipment.

The apparatus 800 includes four process chambers 810, although other embodiments may include more or less than four process chambers 810. Each process chamber 810 is configured to perform one or more semiconductor fabrication processes, such as deposition, etching and/or annealing processes. For example, each chamber 810 may be configured to perform chemical vapor deposition (CVD), plasma enhanced CVD (PECVD), and/or physical vapor deposition (PVD), among others. One or more of the chambers 810 may additionally or alternatively be configured to perform rapid thermal annealing and/or other heat treatment processes.

The apparatus 800 also includes wafer transfer means 820 housed within a central chamber or staging area 805. The wafer transfer means 820 are configured to transfer process wafers between the chambers 810 and load-lock means 830. The wafer transfer means 820 and/or the load-lock means 830 may be partially or fully automated.

Thus, the present disclosure introduces a method comprising forming a photodiode in a substrate and then forming source/drain regions in the substrate, wherein one of the source/drain regions extends over at least a portion of the photodiode. A thermal oxide layer is then grown over the photodiode. The thermal oxide layer may be grown over the photodiode by performing an RTA process utilizing an oxidizing environment. The oxidizing environment may comprise nitrogen ($N_2$) and oxygen ($O_2$), or may consist of nitrogen ($N_2$) and oxygen ($O_2$). Growing the thermal oxide layer over the photodiode may include performing an RTA process which also anneals the source/drain regions in the substrate. The thermal oxide layer may have a thickness of about 25 Å, or the thickness may range between about 15 Å and about 50 Å. Forming the source/drain regions in the substrate may include performing a first RTA process to anneal the source/drain regions in the substrate, and growing the thermal oxide layer over the photodiode may include performing a second RTA process utilizing an oxidizing environment.

The present disclosure also introduces a system comprising means for forming a photodiode in a substrate and means for forming source/drain regions in the substrate, wherein one of the source/drain regions extends over at least a portion of the photodiode. The system also includes means for growing a thermal oxide layer over the photodiode. The thermal oxide layer growing means may include means for performing an RTA process utilizing an oxidizing environment. The oxidizing environment may comprise nitrogen ($N_2$) and oxygen ($O_2$). The thermal oxide layer growing means may include means for performing an RTA process which also anneals the source/drain regions in the substrate. The thermal oxide layer may have a thickness of about 25 Å. The means for forming the source/drain regions may include means for performing a first RTA process to anneal the source/drain regions in the substrate, and the means for growing the thermal oxide layer may include means for performing a second RTA process utilizing an oxidizing environment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a photodiode in a substrate;
   forming source/drain regions in the substrate, wherein one of the source/drain regions extends over at least a portion of the photodiode and beyond the photodiode; and
   growing a thermal oxide layer over the photodiode by performing a rapid thermal anneal (RTA) process utilizing an oxidizing environment consisting of nitrogen and oxygen wherein a thickness of the thermal oxide layer is limited to a thickness required to enclose a damaged portion of a surface of the photodiode;
   wherein forming the source/drain regions in the substrate includes performing another rapid thermal anneal (RTA) process to anneal the source/drain regions in the substrate prior to the growing the thermal oxide layer over the photodiode.

2. The method of claim 1 wherein the thermal oxide layer has a thickness of about 25 Å.

3. The method of claim 1 wherein the thermal oxide layer has a thickness ranging between about 15 Å and about 50 Å.

4. A system, comprising:
   means for forming a photodiode in a substrate;
   means for forming source/drain regions in the substrate, wherein one of the source/drain regions extends over at least a portion of the photodiode and beyond the photodiode; and
   means for growing a thermal oxide layer over the photodiode by performing a rapid thermal anneal (RTA) process utilizing an oxidizing environment consisting of nitrogen and oxygen, wherein a thickness of the thermal oxide layer is limited to a thickness required to enclose a damaged portion of a surface of the photodiode;
   wherein the means for forming the source/drain regions includes means for performing another rapid thermal anneal (RTA) process to anneal the source/drain regions in the substrate prior to the growing the thermal oxide layer.

* * * * *